(12) United States Patent
Kulp

(10) Patent No.: US 6,169,274 B1
(45) Date of Patent: Jan. 2, 2001

(54) HEAT TREATMENT APPARATUS AND METHOD, DETECTING TEMPERATURES AT PLURAL POSITIONS EACH DIFFERENT IN DEPTH IN HOLDING PLATE, AND ESTIMATING TEMPERATURE OF SURFACE OF PLATE CORRESPONDING TO DETECTED RESULT

(75) Inventor: John Kulp, Salado, TX (US)

(73) Assignee: Tokyo Electron Ltd. (JP)

( * ) Notice: Under 35 U.S.C. 154(b), the term of this patent shall be extended for 0 days.

(21) Appl. No.: 09/259,675

(22) Filed: Mar. 1, 1999

(51) Int. Cl.[7] ........................................ H05B 1/02
(52) U.S. Cl. .................... 219/497; 219/121.58; 219/494; 118/724; 438/715
(58) Field of Search ........................... 219/497, 494, 219/505, 501, 121.43, 121.58; 118/724, 725; 156/345, 643.1, 646.1; 438/715, 660

(56) References Cited

U.S. PATENT DOCUMENTS

| | | | |
|---|---|---|---|
| 5,547,539 | * 8/1996 | Arasawa et al. | 156/626.1 |
| 5,660,740 | * 8/1997 | Komino | 156/345 |
| 5,892,207 | * 4/1999 | Kawamura et al. | 219/492 |
| 5,900,297 | * 4/1999 | Rudolph et al. | 428/367 |

* cited by examiner

Primary Examiner—Mark Paschall
(74) Attorney, Agent, or Firm—Rader, Fishman & Grauer

(57) ABSTRACT

A heating element is disposed on a back face side of a holding plate, and a substrate mounted on the surface of the holding plate is designed to be heat-treated. In the holding plate, a hole having a bottom is provided from the back face toward the surface. At positions of different heights, a first temperature sensor and a second temperature sensor are disposed respectively. And a control section estimates the temperatures of the treatment position corresponding to detected results by the first temperature sensor and the second temperature sensor, controls heat energy to be supplied to the holding plate to control a heat treatment temperature of the substrate on the holding plate. Through the above formation, the temperature of the treatment position can be accurately estimated, the treatment position can reach a desired temperature within a short time, regardless of the temperature history, so that the time to treat the substrate at a desired treatment temperature can be made long.

21 Claims, 14 Drawing Sheets

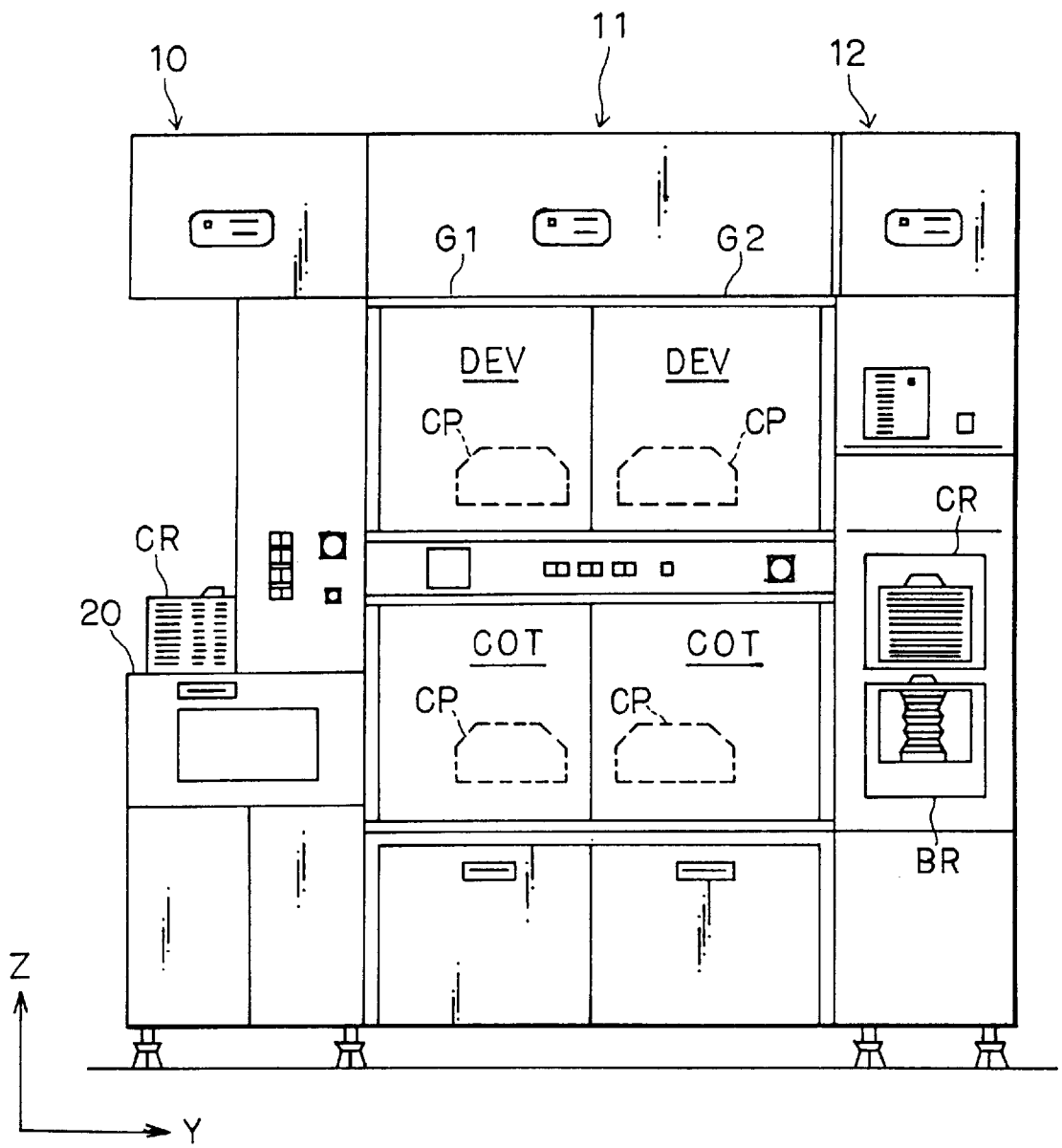
F I G. 2

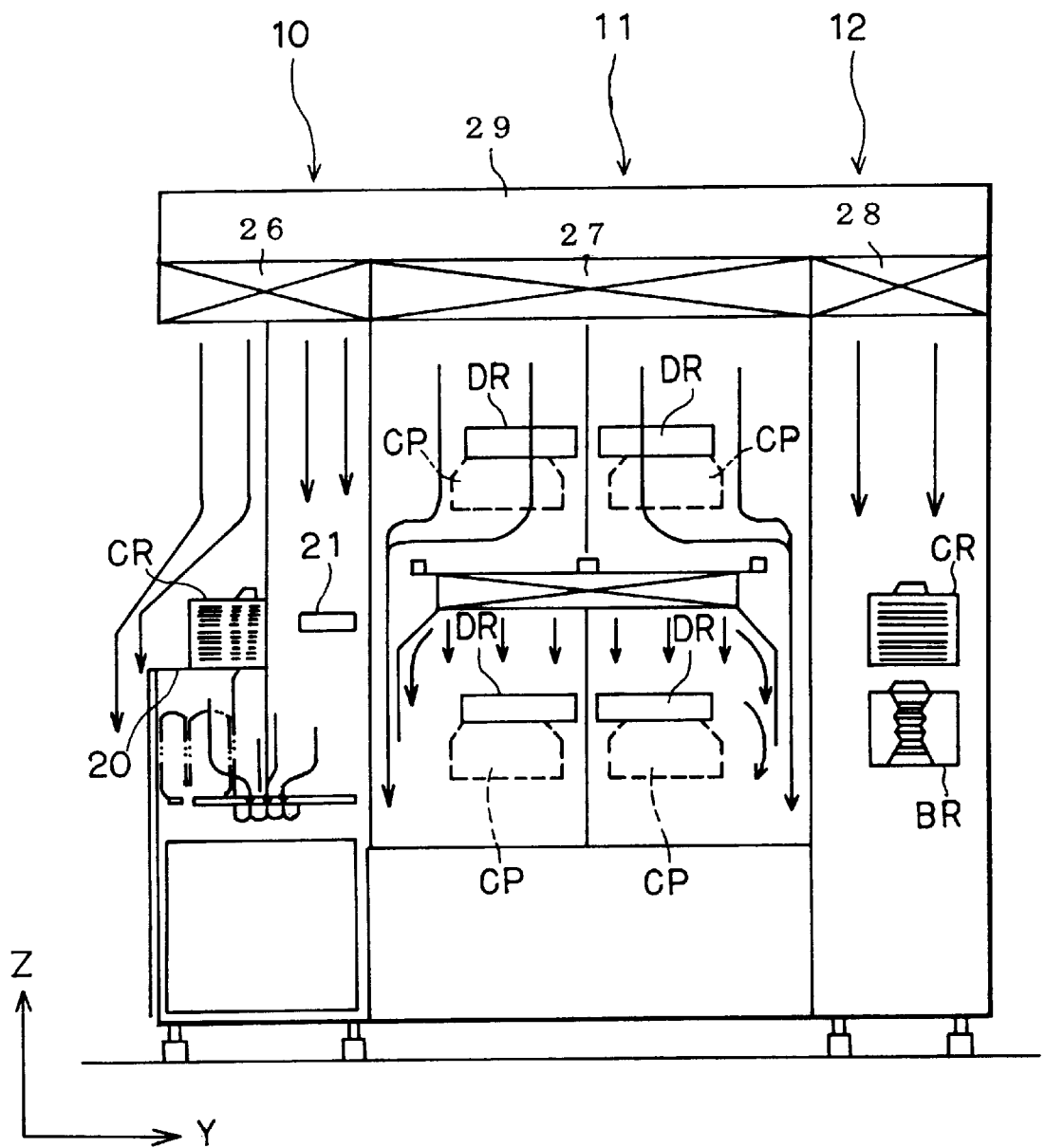
F I G. 4

PRIOR ART

HEAT TREATMENT APPARATUS AND METHOD, DETECTING TEMPERATURES AT PLURAL POSITIONS EACH DIFFERENT IN DEPTH IN HOLDING PLATE, AND ESTIMATING TEMPERATURE OF SURFACE OF PLATE CORRESPONDING TO DETECTED RESULT

BACKGROUND OF THE INVENTION

The present invention relates to a heat treatment apparatus and a heat treatment method for heating or cooling a substrate, for instance, a resist coated semiconductor wafer.

In processes of semiconductor device fabrication, the photolithography technology is used. In the photolithography technology, resist is coated on a surface of a semiconductor wafer (referred to as "a wafer" hereinafter), the coated resist is exposed to a predetermined pattern and developed. Thus, the predetermined pattern resist film is formed on the wafer and moreover the predetermined pattern circuit is formed by a film-forming and etching treatment.

In the process of forming a resist film, one of the important problems is to form a resist film with uniform thickness on a wafer. To form a resist film in a uniform thickness on the wafer, it is important to correctly control the temperature of heat treatment of the resist coated wafer.

In the case of chemically amplified resist, the pattern in the resist is amplified during a heat treatment step prior to develop. To achieve uniformity and consistency in this pattern, it is important to correctly control the temperature of (heat treatment of) the pre-develop wafer.

In general, a heat treatment apparatus for heating the wafer has a hot plate in which a heating element is disposed on the underside of a holding plate to hold the wafer. In such a heating apparatus, it would be desirable to detect the temperature of the holding plate surface (the treating position) to control the temperature of the holding plate. In most cases, since the temperature at the treating position can not be directly detected, a temperature sensor is buried in the holding plate, and the temperature at the treating position is estimated as being a fixed offset from the temperature detected by the buried temperature sensor. The heating value of the heating element disposed on the underside of the holding plate is controlled corresponding to the estimated temperature.

However, in the above heat treatment apparatus, there is a disadvantage that there exists a physical distance where material of the holding plate and a possible proximity air space lie between a position for treatment and a position where the temperature detector is buried, and a correct temperature control can not be performed because the actual offset between the treating position and the detector position is not fixed for the actual use condition.

For instance, a certain wafer is brought into the heat treatment apparatus immediately, but another wafer may be kept waiting for a long time just in front of the heat treatment apparatus before it is brought into the heat treatment apparatus. In such a case, each wafer has a different thermal load to the plate. Each different thermal load will produce a different offset between the treating position and the temperature detector position for some period of time. During this time, even though the temperature sensor buried in the holding plate detects the same temperature, the actual temperature on the surface of the holding plate is different. Also the high thermal load when the wafer is placed on the plate causes a large offset between the treating position and the detector position. This results in a low treatment temperature until the system stabilizes, giving a short time at the desired treatment temperature. Thus, when the time to treat a wafer at a desired treatment temperature is short, the film thickness of the resist is not stable and the resist film can not be formed in an uniform thickness on the wafer. The pre-develop bake is also less stable by the same mechanism, resulting in a less uniform pattern.

BRIEF SUMMARY OF THE INVENTION

An object of the present invention is to provide a heat treatment apparatus and a heat treatment method to accurately estimate the temperature of the substrate treating position above the surface of the holding plate.

Another object of the present invention is to provide a heat treatment apparatus and a heat treatment method in which the substrate treating position can reach a desired temperature in a short time independent from the temperature history of the substrate and the time for treating the substrate at a desired temperature can be extended.

Still another object of the present invention is to provide a heat treatment apparatus and a heat treatment method in which a temperature sensor provided in the holding plate does not impact the heat treatment of the substrate.

To solve these disadvantages, the first aspect of the present invention is that an apparatus to carry out heat treatment to the substrate includes: a holding plate having a first face and a second face and holding the substrate on the first face; a heat energy supply section supplying heat energy from the second face side; a first temperature sensor disposed at a first position in a first depth from the first face of the holding plate detecting a first temperature of the first position; a second temperature sensor disposed at a second position in a second depth different from the first depth from the first face of the holding plate detecting a second temperature of the second position; and a control section controlling the heat energy to be supplied corresponding to a more accurate estimate of the treating position temperature calculated from the detected first and second temperatures.

The second aspect of the present invention is that an apparatus to carry out cooling treatment to the substrate includes: a holding plate having a first face and a second face and holding the substrate on or near the first face; a supply section supplying cooling energy from the second face side; a first temperature sensor disposed at a first position in a first depth from the first face, detecting a first temperature of the first position; a second temperature sensor disposed at a second position in a second depth from the first face, the second depth different from the first depth, the second temperature sensor detecting a second temperature of the second position; and a control section controlling the supplied cooling energy corresponding to a more accurate estimate of the treating position temperature calculated from the detected first and second temperatures.

The third aspect of the present invention is that an apparatus to carry out the heat treatment to the substrate includes: a holding plate having a first face and a second face, holding the substrate on or near the first face and having a hole of a predetermined depth in the second face toward the first face; a heat energy supply section supplying heat energy from the second face side; a first temperature sensor disposed at a first position in the hole to detect the first temperature at the first position; a second temperature sensor disposed at a second position which is different from the first position in the above described hole to detect the second temperature at the second position; and a control section to control the supplied heat energy corresponding to the detected first and second temperatures.

The fourth aspect of the present invention is that an apparatus to carry out a treatment to the substrate includes: a holding plate having a first face and a second face and holding the substrate on or near the first face; an energy supply section supplying the energy from the second face; means for detecting temperatures at positions each different in depth from the first face; and control means to control the energy to be supplied corresponding to the detected temperatures.

The fifth aspect of the present invention is that a method to supply heat energy from a back face of a holding plate and to heat-treat a substrate held on the surface of the holding plate includes: a step of detecting the first temperature at the first position in the first depth from the surface of the holding plate; a step of detecting the second temperature at the second position in the second depth which is different from the above described first depth from the surface of the holding plate; and a step of controlling the supplied heat energy corresponding to the detected first and second temperatures.

In the present invention, since temperatures at positions that are different in depth in the holding plate are detected and the temperature at the substrate treating position is estimated corresponding to these detected temperatures, the temperature at the substrate treating position plate can be more accurately estimated. Furthermore, since the heat or cooling energy to be supplied to the holding plate is controlled corresponding to such an accurately estimated temperature, the substrate treating position reaches a desired temperature in a short time indifferent from the heat history of the substrate, so that the time to treat the substrate at a desired temperature can be extended, thereby a resist layer on a wafer, for instance, can be formed in a uniform thickness.

In addition, in the present invention, since two temperature sensors are disposed in a hole provided in the holding plate, extending from the second face toward the first face, deleterious effects caused by these temperature sensors disposed in the holding plate on the heat treatment of the substrate decreases.

These objects and other objects, and advantages of the present invention can be easily confirmed with the following description and the accompanying drawings.

BRIEF DESCRIPTION OF THE SEVERAL VIEWS OF THE DRAWING

FIG. 2 is a front view of the resist coating and developing system shown in FIG. 1;

FIG. 4 is a front view showing air flow in the resist coating and development system shown in FIG. 1;

DETAILED DESCRIPTION OF THE INVENTION

Figure 1:
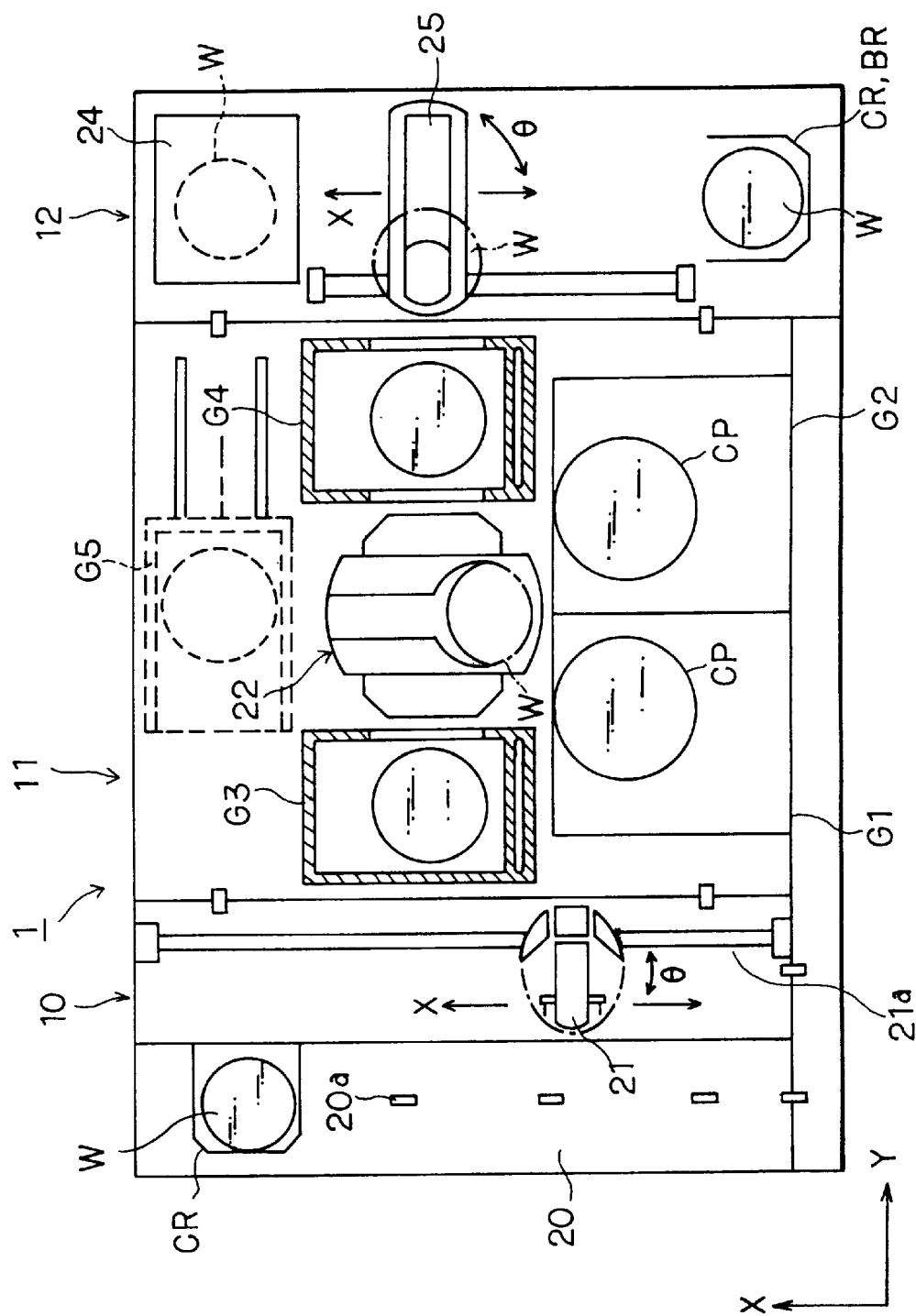
FIG. 1 is a plane view of a resist coating and developing system according to an embodiment of the present invention.

As shown in FIG. 1, a resist coating and development system 1 is a system for coating chemically-amplifying-type resist on a semiconductor wafer and developing the resist and has a configuration in which a cassette station 10, a process station 11 and an interface section 12 are integrally connected. In the cassette station 10, wafers W (a plurality of wafers W, for example, twenty-five wafers per cassette C) are carried in the resist coating and developing system 1 from the outside or carried out from the resist coating and developing system 1 to the outside, and also carried in/out from the cassette C. In the process station 11, various kinds of treatment units are multi-tiered at designated positions and each treatment unit gives a predetermined treatment to the wafers W one by one in a coating and developing process. In the interface section 12, the wafer W is sent and received to/from an aligner 13 which is disposed adjacent to the resist coating and developing system 1.

In the cassette station 10, as shown in FIG. 1, a plurality of cassettes C (four cassettes, for example) are disposed with respective ways in/out for wafers W opening to the process station 11 side at the positions of positioning projections 20a on a cassette mounting table 20 as a mounting section in a line in an X-direction (a vertical direction in FIG. 1). A wafer carrier unit 21, which can move in the direction of disposition of the cassettes C (an X-direction) and in the direction of disposition of the wafers W stored in the cassette C (a Z-direction; a vertical direction), is movable along a carrier path 21a to be selectively accessible to each cassette C.

The wafer carrier unit 21 is rotatable in a θ-direction and accessible to an alignment unit (ALIM) and an extension unit (EXIT) included in multi-tiered units of a third treatment unit group G3 on the process station 11 side as described later.

In the process station 11, as shown in FIG. 1, a carrier unit 22 with a vertical carrier system is placed in a center portion thereof. Around the carrier unit 22, one or various kinds of treatment units as treatment chambers are multi-tiered to compose a treatment unit group. In the resist coating and developing system 1, five treatment unit groups G1, G2, G3, G4, and G5 can be arranged. The first and the second treatment unit groups G1 and G2 can be arranged on the front side of the system, the third treatment unit group G3 can be disposed adjacent to the cassette station 10, the fourth treatment unit group G4 can be disposed adjacent to the interface section 12, and the fifth treatment unit group G5 shown with a dashed line can be disposed on the back side. The carrier unit 22 is rotatable in a θ-direction and movable in a Z-direction, and can receive/send the wafer W from/to each treatment unit.

As shown in FIG. 2, in the first treatment unit group G1, two spinner-type treatment units for mounting the wafer W on a spin chuck in a cup CP and performing predetermined treatments, for example, a resist solution coating unit (COT) and a developing unit (DEV) are two-tiered from the bottom in order. Also in the second treatment unit group G2 similarly to the first treatment unit group G1, two spinner-type treatment units, for example, a resist solution coating unit (COT) and a developing unit (DEV) are two-tiered from the bottom in order.

Figure 3:
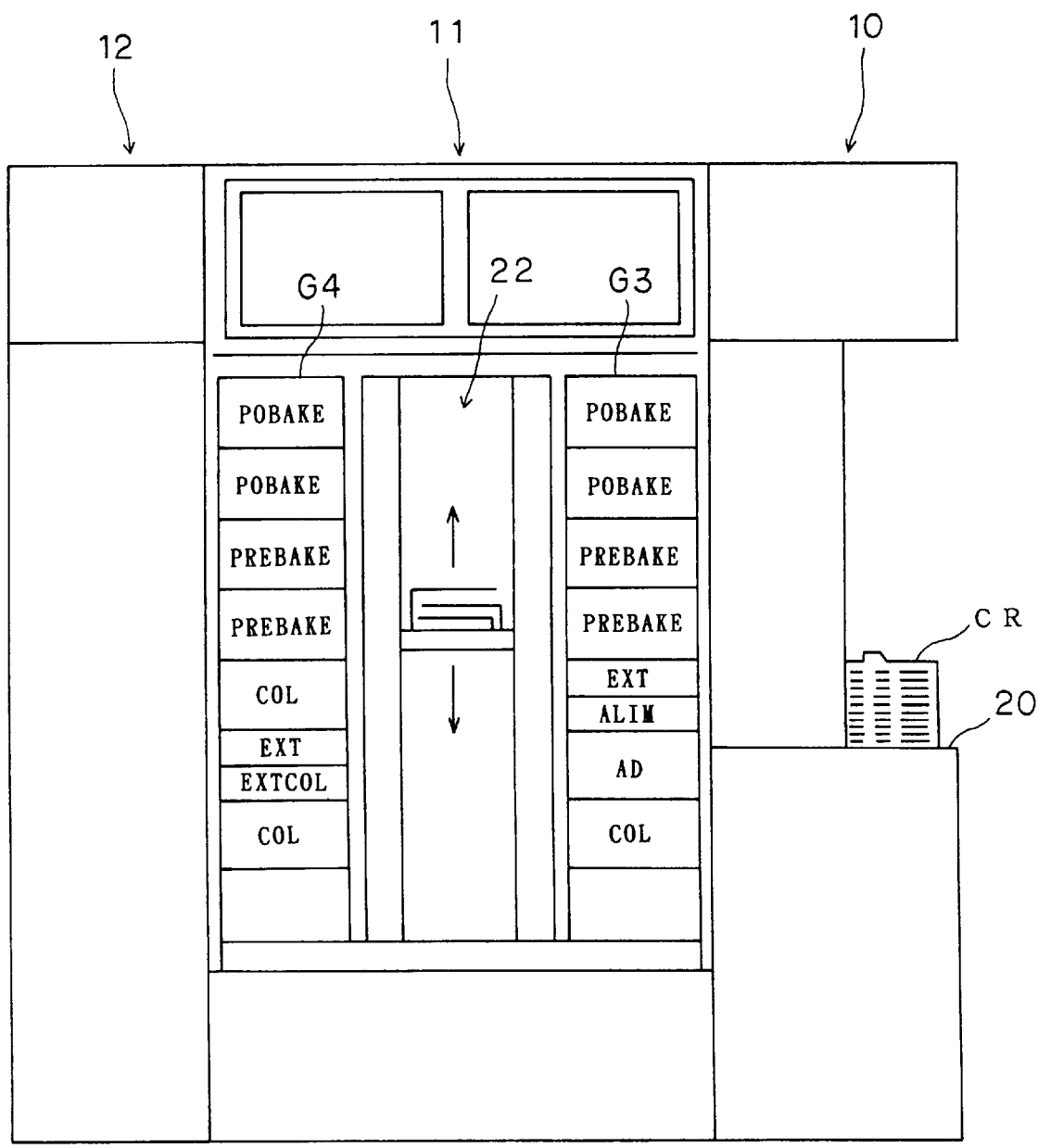
FIG. 3 is a rear view of the resist coating and developing system shown in FIG. 1.

As shown in FIG. 3, in the third treatment unit group G3, oven-type treatment units in which the wafer W is mounted on a mounting table (not shown) to perform predetermined treatments, for example, a cooling unit (COL) for performing cooling treatment, an adhesion unit (AD) for performing the so-called hydrophobid treatment to improve fixing of resist, the alignment unit (ALIM) for positioning, the extension unit (EXT), a heat treatment unit (PREBAKE) for conducting prebaking to perform heat treatment before exposing treatment, and a heat treatment unit (POBAKE) for postbaking are tiered, for instance, eight-tiered from the bottom in order.

Also in the fourth treatment unit group G4, oven-type treatment units in which the wafer is mounted on a mounting table to perform predetermined treatment, for example, a cooling unit (COL) for performing cooling treatment, an extension and cooling unit (EXTCOL) also serving as a cooling unit, an extension unit (EXT), an adhesion unit (AD), a heat treatment unit (PREBAKE) for prebaking and a heat treatment unit (POBAKE) for postbaking are eight-tiered, for example, from the bottom in order.

As shown in FIG. 1, the interface section 12 is the same as the process station 11 in depth-directional (X-directional) size, but it is smaller than the process station 11 in cross directional size. As shown in FIGS. 1 and 2, movable pickup cassettes CR and fixed buffer cassettes BR are arranged in two stages on the front side of the interface section 12, and a peripheral aligner 24 is disposed on the back side thereof.

A wafer carrier unit 25 is disposed in the center portion of the interface section 12. The wafer carrier unit 25 moves in an X-direction and in a Z-direction (a vertical direction) to be accessible to both the cassettes CR, BR, and the peripheral aligner 24. The wafer carrier unit 25 is also rotatable in a θ-direction to be accessible to the extension unit (EXT) included in the fourth treatment unit group G4 on the process station 11 side, and moreover to an adjacent wafer delivery table (not shown) on the aligner side.

As shown in FIG. 4, filters 26, 27, and 28 are attached on the upper portions of the cassette station 10, the process station 11, and the interface section 12, respectively. These filters have an upper space 29 in common. The upper space 29 communicates with a lower-side air conditioner (not shown) through a duct (not shown) so that clean air in which ammonia is removed and the humidity and temperature thereof are controlled, is supplied from the air conditioner to the upper space 29. The clean air passes through each filter from the upper space 29 and is blown downward. Thus the downflow of the clean air is formed on portions 10, 11, and 12.

Figure 5:
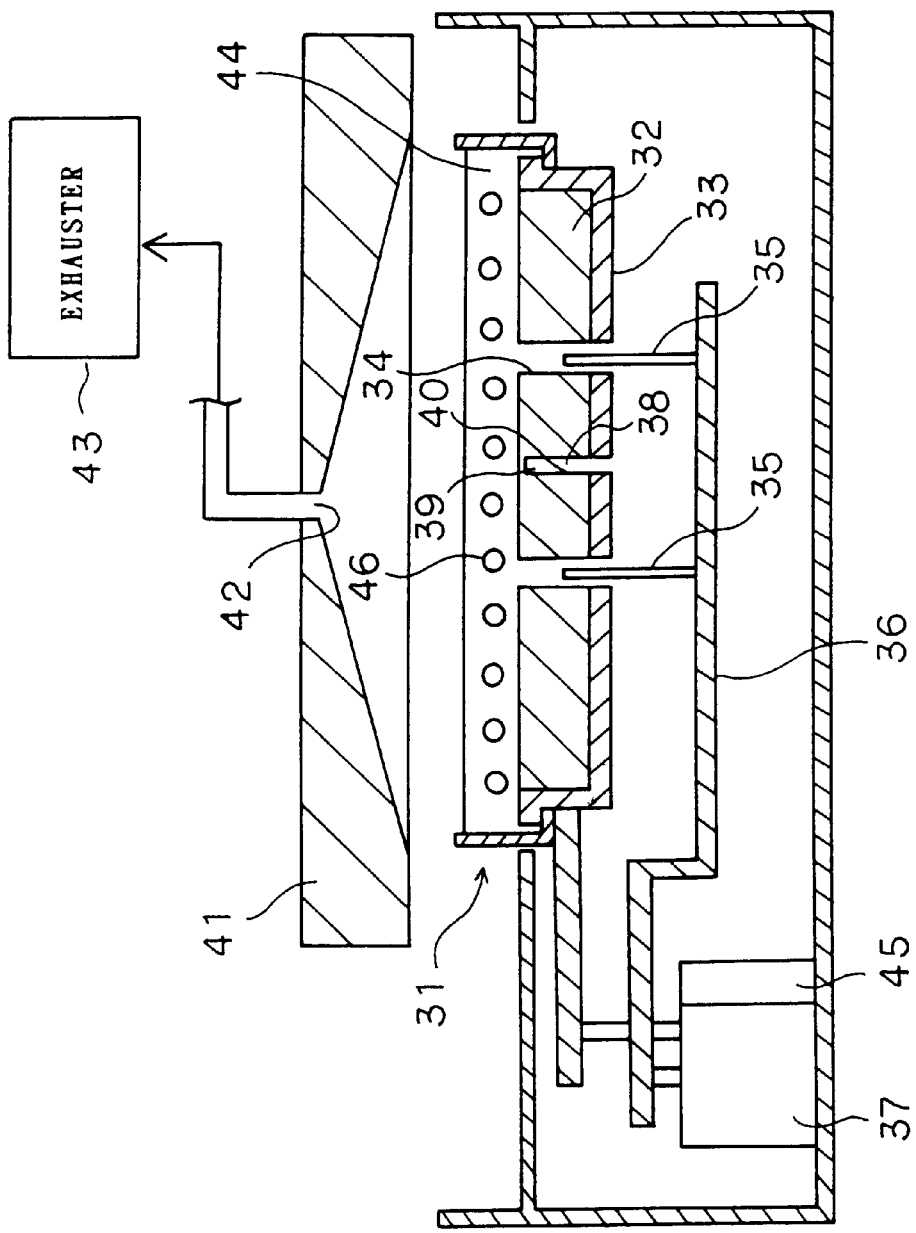
FIG. 5 is a front view of a heat treatment apparatus shown in FIG. 3.
Figure 6:
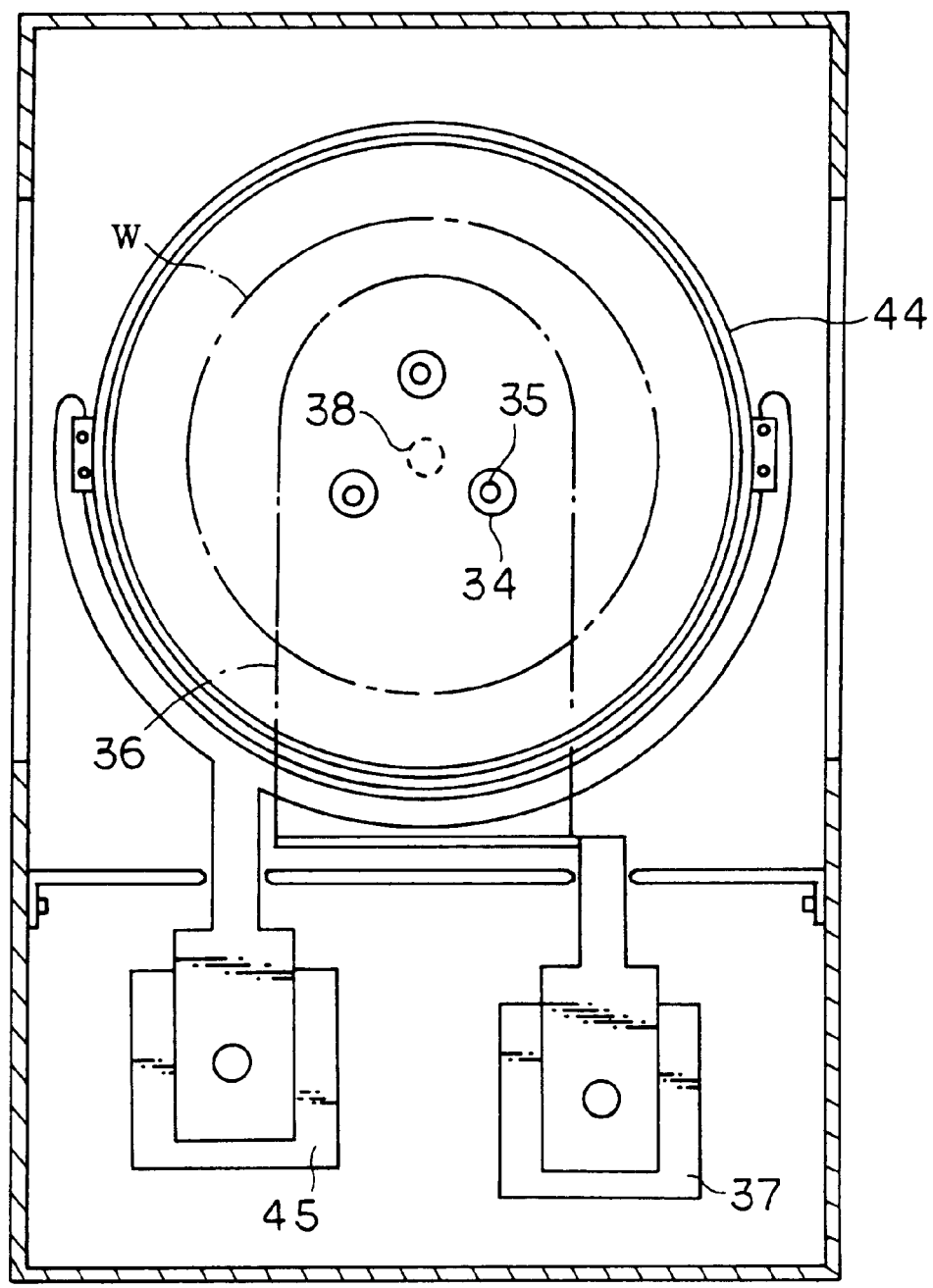
FIG. 6 is a plane view of the heat treatment apparatus shown in FIG. 5.

As shown in FIG. 5 and FIG. 6, in the substantially central portion of the above heat treatment unit (PREBAKE), a hot plate 31 is disposed to heat-treat the wafer W. In the hot plate 31, a heating element 33 which has a similar shape and size, for instance, to a holding plate 32, is disposed in close contact with the holding plate 32 on the underside face side of the circular holding plate 32 having a little larger diameter than that of the wafer W. The heating element 33 is defined by, for instance, an electric resistor which generates heat and the temperature for heating is controlled by the amperage of the current. The amperage of the current is controlled by a control section which will be described later.

Through holes 34 are provided between the front surface and the back surface of the hot plate 31 at several positions, for instance, three positions. In these through-holes 34, a plurality of support pins 35, for instance three pins, for delivery of the wafer W are inserted in a manner that the pins can appear and disappear. These support pins 35 are integrally united on the underside of the holding plate 32 with a connecting member 36 disposed on the underside of the holding plate 32. The connecting member 36 is connected to a hoisting and lowering mechanism 37 disposed on the underside of the holding plate 32. By a vertical movement of the hoisting and lowering mechanism 37, the support pins 35 protrude and disappear from or into the surface of the holding plate 32. The support pins 35 send and receive the wafer W to/from the wafer carrier unit 22 in a protruding state from the surface of the holding plate 32. The support pins 35 which receive the wafer W from the wafer carrier unit 22 descend and disappear into the holding plate 32, thereby the wafer W comes in contact with, or at a small space above, the surface of the holding plate 32 to heat treat the wafer W.

Figure 7:
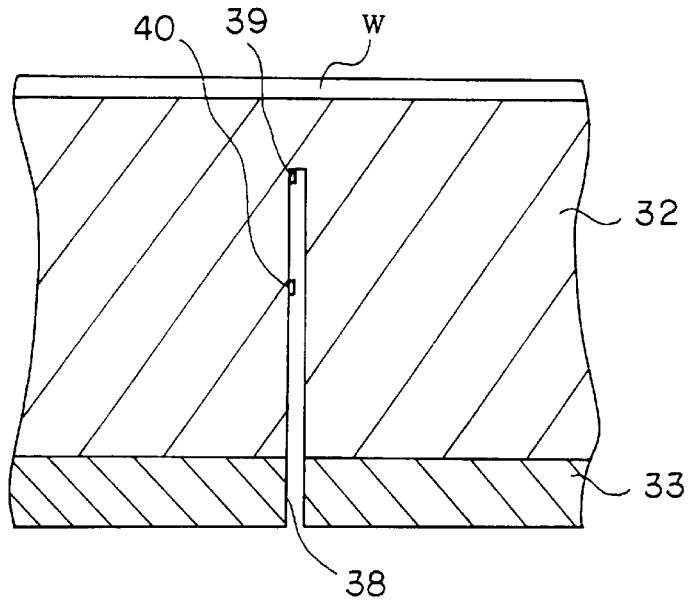
FIG. 7 is a partially enlarged front view of the heat treatment apparatus shown in FIG. 5.

As shown in FIG. 7, in near the center of the holding plate 32 and the heating element 33, a hole 38 having a predetermined depth with a bottom is provided from the back face of the holding plate 32 toward the surface. A distance between the bottom of the hole 38 and the surface of the holding plate 32 is set to be within the range of, for instance, 3 mm to 5 mm. At the bottom of the hole 38 (the nearest position to the surface of the holding plate 32 within the hole 38), a first temperature sensor 39, that is, for instance, a thermocouple, is provided. At a position 3 mm to 5 mm away from the first temperature sensor 39 in the hole 38, a second temperature sensor 40, that is, for instance, a thermocouple, is provided. Therefore, the first temperature sensor 39 and the second temperature sensor 40 are disposed in a line in the holding plate 32 substantially perpendicular to the surface and the back face of the holding plate 32. The first temperature sensor 39 and the second temperature sensor 40 are attached, for instance, on the side wall of the hole 38, thereby the temperature of the holding plate 32 can be more accurately measured. And by making a distance between, for instance, the first temperature sensor 39 disposed in the bottom of the hole 38 and the surface of the holding plate 32, and a distance between the first temperature sensor 39 and the second temperature sensor 40 approximately equal, an estimate of the temperature at the treatment position W, which will be later described, can be more easily carried out.

Above the holding plate 32, a lid body 41 is disposed to cover the wafer W held by the holding plate 32. The lid body 41 is vertically movable with a hoisting and lowering mechanism (not shown). In the unit, the wafer W is sent and received to/from the carrier unit 22 while the lid body 41 ascends and is in an open state, and the wafer W is heat treated while the lid body 41 descends and is in a closed state, making a closed space.

The lid body 41 has a structure slanting upward nearly to the center and at the center, that is, a position nearly corresponding to the center of the wafer W held by the holding plate 32, an exhaust port 42 is provided. An exhauster 43 composed of a vacuum pump and the like is connected to the exhaust port 42 so that the exhausting in the closed space is carried out.

Around the hot plate 31, a shutter member 44 is disposed surrounding the hot plate 31 in a manner that the shutter member 44 can appear and disappear. The shutter member 44 is vertically moved by a hoisting and lowering mechanism 45 disposed on the underside of the hot plate 31, Furthermore, on the inside wall of the shutter member 44, a number of blow-out nozzles 46 are provided to jet out, for instance, high temperature inert gas. The blow-out nozzles 46 are connected to a high temperature gas supplying apparatus 47 to supply high temperature gas to the blow-out nozzles 46. When the wafer W is held on the holding plate 32 and is heat-treated, the shutter member 44 protrudes from the surface of the hot plate 31, so that high temperature gas is jetted out from the blow-out nozzles 46 toward the surface of the wafer W held on the holding plate 32.

Figure 8:
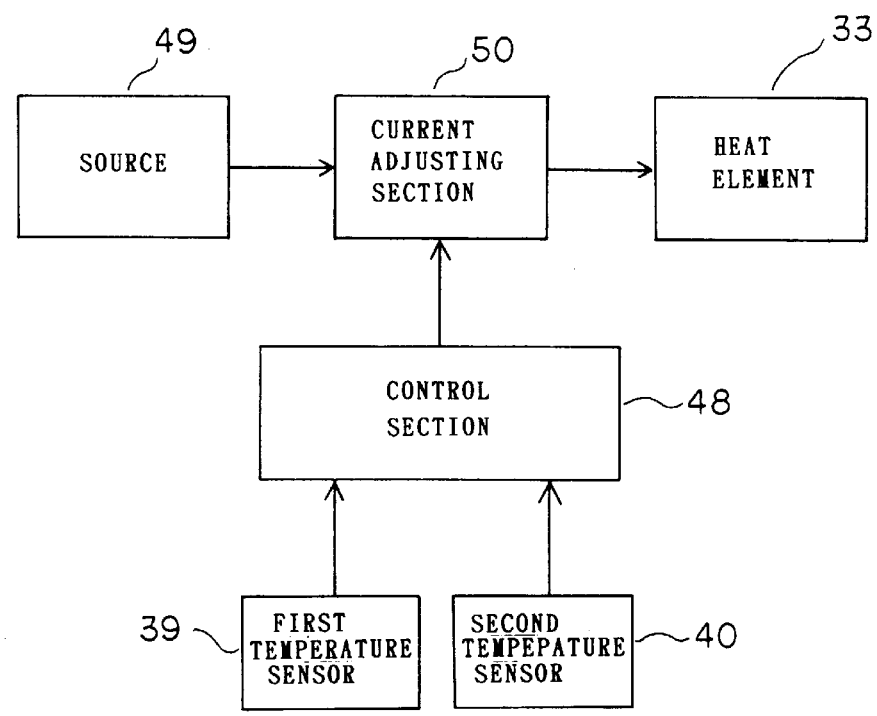
FIG. 8 is a block diagram of a control system of the heat treatment apparatus shown in FIG. 5.

As shown in FIG. 8, the first temperature sensor 39 and the second temperature sensor 40 are electrically connected to the controlling section 48 so that electric signals representing detected results by the first temperature sensor 39 and the second temperature sensor 40 are sent to the control section 48. An electric current adjusting section 50 is inserted between the heating element 33 and an electric source 49, and the electric current adjusting section 50 is electrically connected to the control section 48. The control section 48 estimates the temperature at the treatment position W corresponding to the detected result by the first temperature sensor 39 and the second temperature sensor 40, and heat energy to be supplied to the holding plate 32 is controlled by controlling the current running to the heating element 33 corresponding to the estimated temperature through the current adjusting section 50 so that the heat treatment temperature of the wafer W on the holding plate 32 is controlled.

Figure 9:
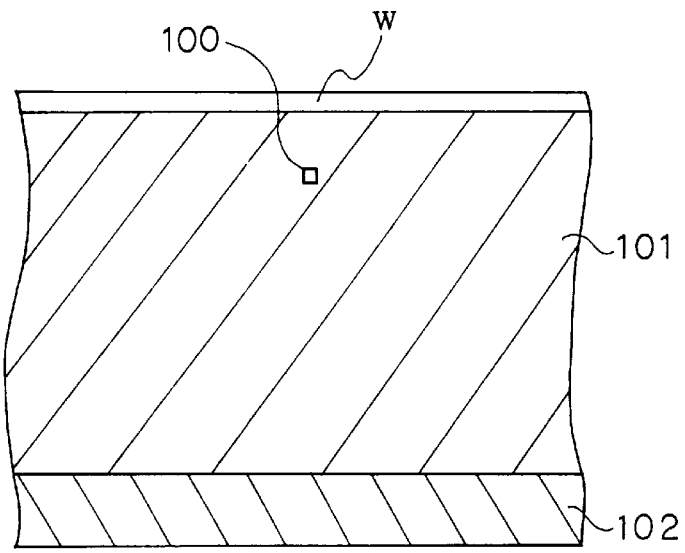
FIG. 9 is a partially enlarged front view of a conventional heat treatment apparatus.

In the conventional heat treatment unit, as shown in FIG. 9, a temperature sensor 100 is buried in the holding plate 101. A heating element 102 is disposed at the underside of the holding plate 101. There appears a temperature difference between a treatment position on the surface of the holding plate 101 which holds the wafer W and the position where the temperature sensor 100 is buried (control point).

Figure 10:
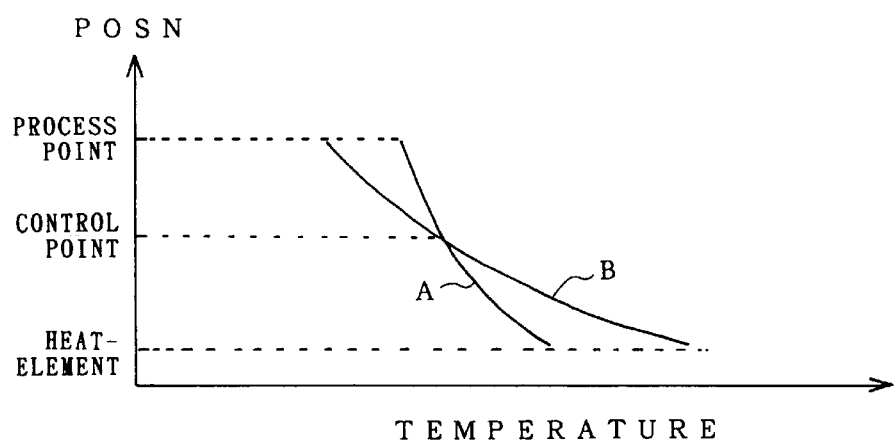
FIG. 10 is a diagram showing a temperature slope in the holding plate in the conventional heat treatment apparatus.

In a static system, such a temperature difference can be easily compensated. However, it is difficult to compensate the temperature difference in a dynamic system. As shown in FIG. 10, for instance, when a wafer W is first placed on or near the holding plate 32, it must be heated resulting in temperature curve B, and a large temperature difference between the heat treatment position and the control point is seen. As the system stabilized it moves to temperature curve A with a small temperature difference between the heat treatment position and the control point. There is a secondary effect in which the temperature history of the wafer brought into the heat treatment unit is not uniform. As shown in FIG. 10, for instance, when a wafer W is kept waiting for a long time just in front of the heat treatment unit before it is brought into the heat treatment unit, the temperature curve shows the curve "A" in a holding plate 101. That is, a temperature difference between the heat treatment position and the control point is small. On the other hand, when the wafer W is immediately brought into the heat treatment unit as the wafer W is still cold, the temperature curve shows the curve "B" in the holding plate 101.

That is, the temperature curve rotates around the control point according to the temperature history of the wafer W, while any information is actually not given to the user side. Therefore, though the offset is not uniform to compensate the temperature difference between the treatment position and the control point, this fact is not recognized at the control point where the temperature is actually detected, after all a particular energy is not supplied from the heating element 102 by the time when a curve "A" state is obtained from a curve "B" state, it takes a long time to become the curve "A" state from the curve "B" state.

Figure 11:
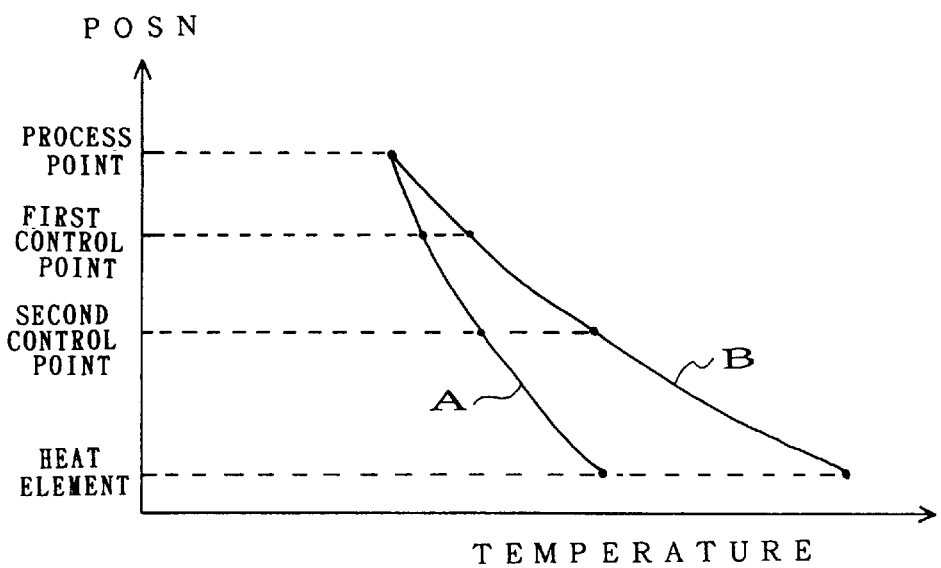
FIG. 11 is a diagram showing a temperature slope in the holding plate in the heat treatment apparatus.

On the other hand, in the present invention, as shown in FIG. 7, since the first temperature sensor 39 and the second temperature sensor 40 are disposed at positions each different in depth in the holding plate 32, it becomes possible to nearly correctly estimate the temperature at the treatment position. In the control section 48, as shown in FIG. 11, by using the temperature at the first control point detected by the first temperature sensor 39 and the temperature at the second control point detected by the second temperature sensor 40, the temperature at the treatment position is estimated. Such an estimate of the treatment position can be calculated in various manners. For instance, a method of referring to a temperature table which is previously prepared using a software can be used. The temperature curve thus estimated (for instance, from the curve "A" to the curve "B") rotates around the treatment position according to the temperature history of the wafer W. Therefore, the temperature at the treating position can be almost accurately estimated, and quick arrival at the desired treatment temperature can be realized.

Figure 12:
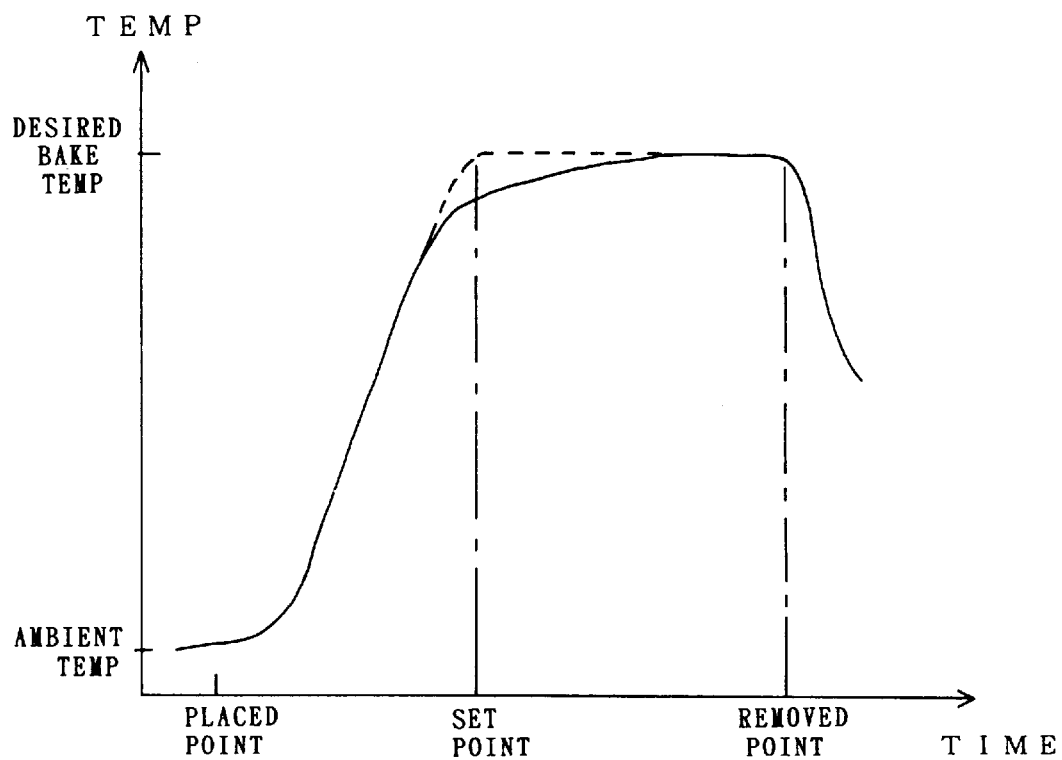
FIG. 12 is a diagram showing a temperature variation with time on the surface of the substrate being treated in the heat treatment apparatus.

Consequently, as shown in FIG. 12, in the conventional heat treatment unit, at a some time after the wafer is placed on or near the holding plate, the control point reaches the control set point, and heating by the heating element is considerably weakened. However, as shown with a solid line in FIG. 12, the surface of the holding plate has not actually reached the desired bake temperature because of the additional offset shown in curve B of FIG. 10. It takes a considerable additional time for the system to stabilize allowing the holding plate to reach the desired bake temperature. Accordingly, time of heat-treatment of the wafer at a desired treatment temperature is shortened, so that the thickness of the resist layer can not be stable.

On the other hand, in the heat treatment apparatus according to the present invention, the wafer, mounted on the holding plate, as shown with a dotted line in FIG. 12, reaches an almost accurately estimated desired treatment temperature (set point), much more quickly, because the offset variability is greatly reduce and the time of heat-treatment of the wafer at the desired treatment temperature is increased, and the thickness of the resist layer can be stable.

In addition, in the heat treatment apparatus according to the present invention, the operator or a process engineer can almost accurately observe the temperature of the treatment position. Because the variable offset from a single control point does not have to be considered.

Furthermore, in the above described embodiment, since a high pressure gas is jetted out toward the surface of the wafer W which is held by the holding plate 32 from the shutter member 44 disposed around the hot plate 31, the exhaust port 42 is provided at the position corresponding to nearly the center of the wafer W held by the holding plate 32, so that all high pressure gas is exhausted through nearly the central portion of the wafer W, the vicinity of almost the center of the wafer W becomes a point of the thermally mean value. Since the first temperature sensor 39 and the second temperature sensor 40 are disposed in the holding plate 32 so that they are placed near the center of the wafer W held by the holding plate 32, the first temperature sensor 39 and the second temperature sensor 40 can detect an average temperature in the system.

The present invention can be applied not only to the heat treatment unit but also, for instance, to a cooling treatment unit (COL) shown in FIG. 3. The application example will be explained below.

Figure 13:
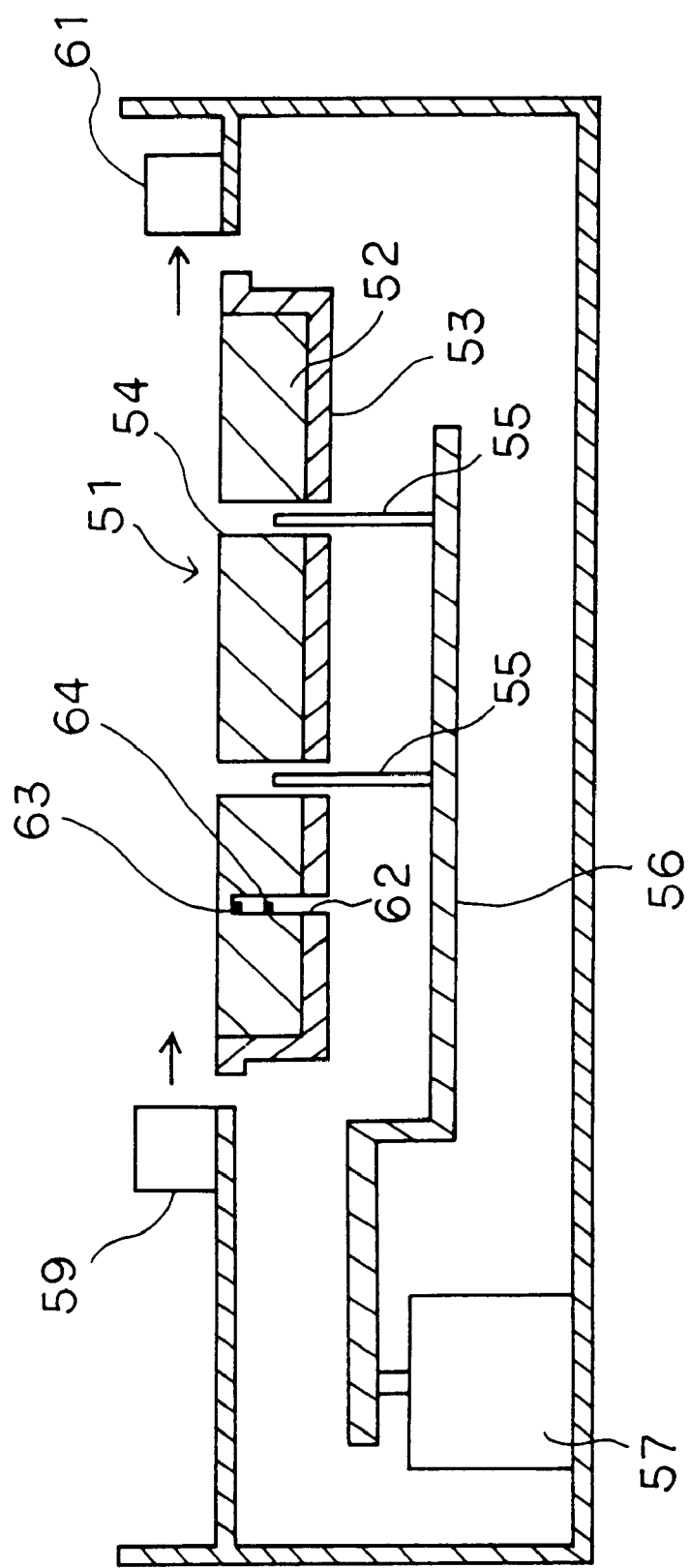
FIG. 13 is a front view of a cooling treatment apparatus shown in FIG. 3.

As shown in FIG. 13, a cooling plate 51 to carry out the cooling treatment of the wafer W is disposed at nearly the center of the above cooling treatment unit (COL). In the cooling plate 51, a cooling element 53 which has nearly the same size and shape as, for instance, the holding plate 52 is disposed in close contact with the holding plate 52 on the back face side of the circular holding plate 52 having a little larger diameter than, for instance, that of the wafer W. The cooling element 53 is structured, for instance, by vertically and horizontally arranging Peltier elements therein. In the cooling element 53, temperature control can be achieved by controlling the amperage of the current passing through, for instance, the Peltier element.

Between the surface and the back face of the cooling plate 51, through-holes 54 are provided at several positions, for instance, three positions. In these through-holes 54, a plurality of support pins 55, for instance, three pins, for delivery of the wafer W are inserted in a manner that the pins can appear and disappear. These support pins 55 are integrally united in the back face side of the holding plate 52 with a connecting member 56 disposed on the back face side of the holding plate 52. The connecting member 56 is connected to a hoisting and lowering mechanism 57 disposed on the back face side of the holding plate 53.

On one side of the cooling plate 51, a blow-out member 59 is provided, in which a number of blow-out nozzles are provided to blow out a cooling gas toward the wafer W held on the surface of the holding plate 52. On the other hand, on the other side of the cooling plate 51, an exhausting member 61 which is provided with a number of exhaust ports to exhaust a cooling gas is disposed. Accordingly, the cooling gas passes through over the wafer W which is held on the surface of the holding plate 52 from one side to the other side of the cooling plate 51.

Figure 14:
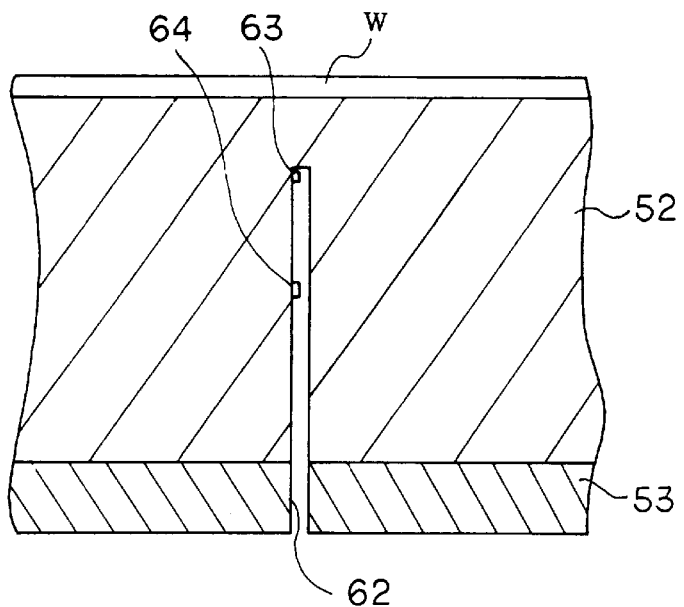
FIG. 14 is a partially enlarged front view of the cooling treatment apparatus shown in FIG. 13.

As shown in FIG. 14, at a position shifting from the center of the holding plate 52 toward the blow-out member 59 side, a hole 62 having a bottom in a predetermined depth is provided from the back face of the holding plate 52 toward the surface thereof. On the bottom of the hole 62, a first temperature sensor 63, that is a thermocouple, for instance, is provided. At the position apart downward in the drawing from the first temperature sensor 63 in the hole 62, a second temperature sensor 64, that is a thermocouple, for instance, is provided.

Figure 15:
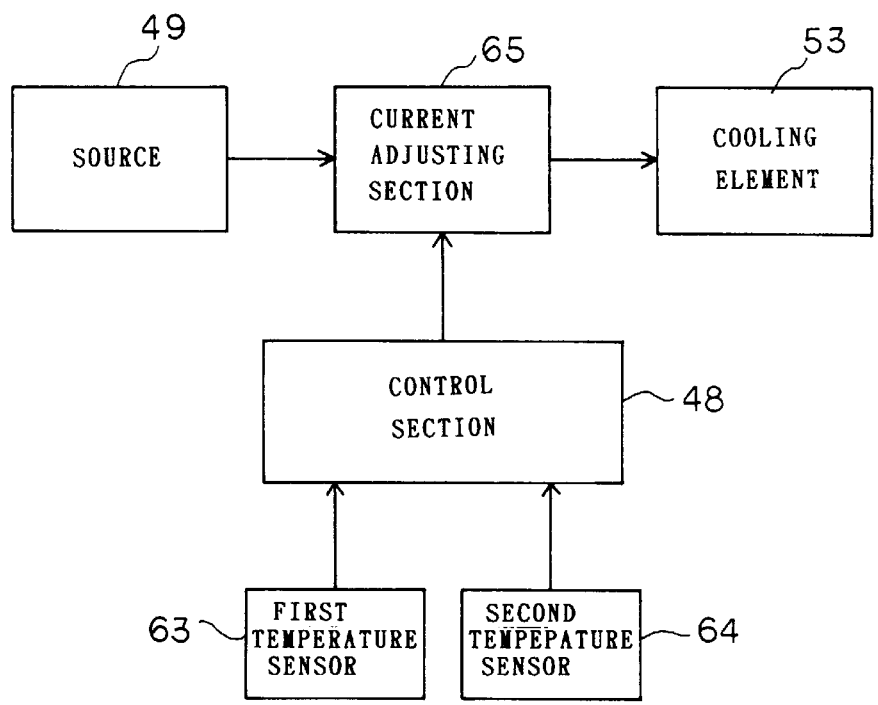
FIG. 15 is a block diagram of a control system of the cooling treatment apparatus shown in FIG. 13.

As shown in FIG. 15, the first temperature sensor 63 and the second temperature sensor 64 are electrically connected to the control section 48 so that electric signals as detected results by the first temperature sensor 63 and the second temperature sensor 64 are sent to the control section 48. An electric current adjusting section 65 is inserted between the cooling element 53 and the electric source 49, and the electric current adjusting section 65 is electrically connected to the control section 48. The control section 48 estimates the temperature of the treatment position W corresponding to the detected results by the temperature sensor 63 and the second temperature sensor 64, and by controlling the current which is sent to through the cooling element 53 through the current adjusting section 65 corresponding to this estimated temperature, heat energy to be supplied to the holding plate 52 is controlled to control the cooling treatment temperature of the wafer W on the holding plate 52.

Figure 16:
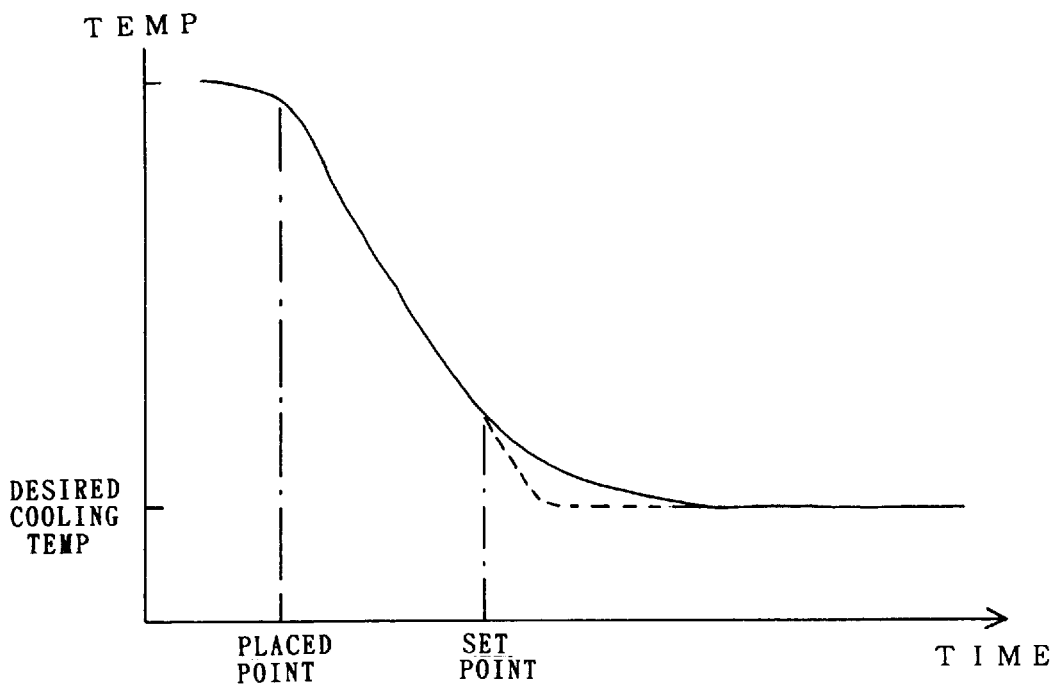
FIG. 16 is a diagram showing a temperature slope of the substrate being cooled in the cooling treatment apparatus.

In thus structured cooling treatment unit, in a similar way to the above described heat treatment unit, the control section 48 controls the cooling treatment temperature of the wafer W on or near the holding plate 52 corresponding to the detected results by the first temperature sensor 63 and the second temperature sensor 64. Accordingly, as shown in FIG. 16, in the conventional cooling treatment unit, at a predetermined time after the wafer is mounted on the holding plate, the temperature of the wafer is lowered to an estimated desired temperature (set point) and the cooling by the cooling element is considerably weakened. However, as shown with a solid line in FIG. 16, since the offset is not fixed, the wafer has not actually reached the set point. It takes an additional time for the wafer to lower to the an actual set point. Accordingly, the time to being the wafer to the desired set point gets longer, so that the throughput of the process gets worse.

On the other hand, in the cooling treatment apparatus according to the present invention, at a predetermined time later after the wafer is mounted on the holding plate, as shown with a dotted line in FIG. 16, since the temperature of the wafer drops to an almost accurately estimated desired treatment temperature (set point), time for the wafer to reach the desired set point is shortened and improvement of the throughput can be achieved.

Figure 17:
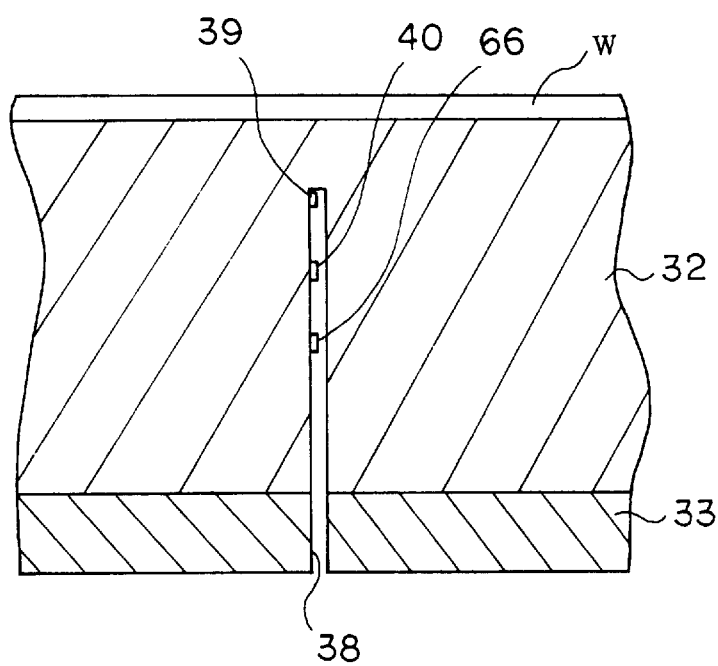
FIG. 17 is a partially enlarged front view of a heat treatment apparatus according to another embodiment.
Figure 18:
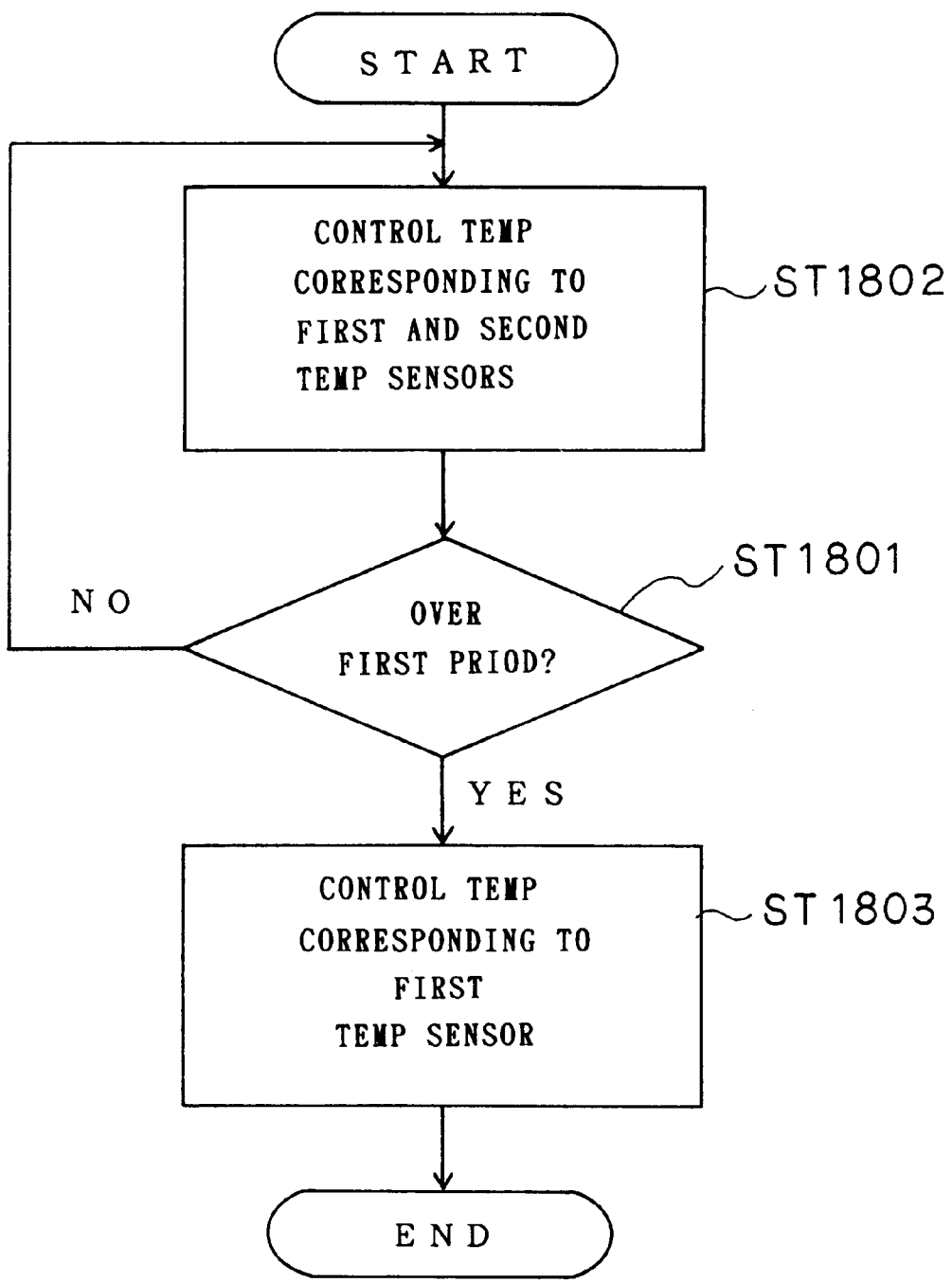
FIG. 18 is a flow chart showing a movement of a control system in a heat treatment apparatus according to another embodiment.

Although in the above described embodiment, an example of providing two temperature sensors is illustrated, as shown in FIG. 17, in addition to the first temperature sensor 39 and the second temperature sensor 40, a third temperature sensor 66 can be provided at a position different in height from these sensors. By providing the sensor, the temperature of the surface of the holding plate 32 can be further accurately estimated. The number of temperature sensors can be four or more. However, when the number of the temperature sensors increases, a load of the control operation by the control section also increases. So, as shown in FIG. 18, the control section 48 may control the heat energy (step 1802) supplied to the holding plate 32 corresponding to each detected temperature by a plurality of temperature sensors 39, and 40 for the first period (step 1801) at least exceeding a estimated period within which, for instance, the surface of the holding plate 32 is estimated to reach a desired treatment temperature, and after the first period, the control section 48 may control the heat energy (step 1803) supplied to the holding plate corresponding to a detected temperature by one temperature sensor, preferably by the first temperature sensor 39.

Figure 19:
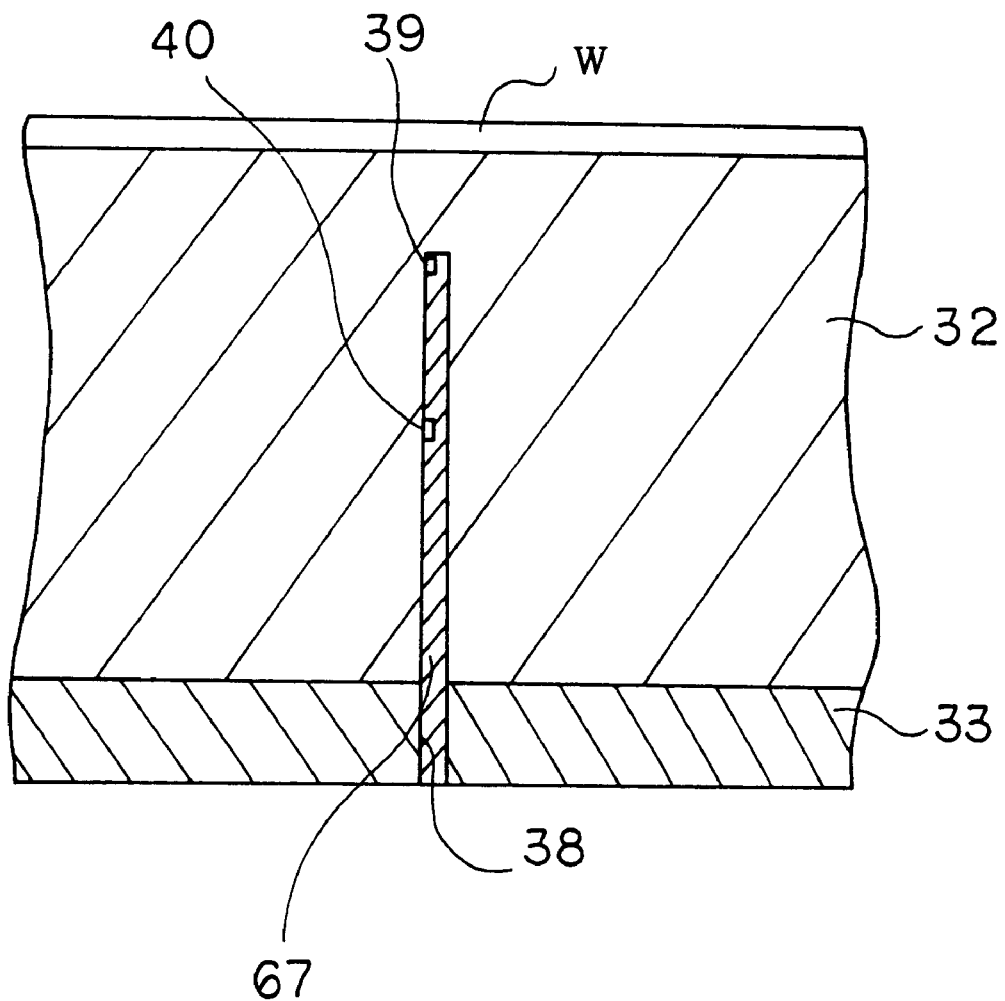
FIG. 19 is a partially enlarged front view of a heat treatment apparatus according to still another embodiment.

In addition, as shown in FIG. 19, a loading member 67 which has preferably the same thermal characteristics as the holding plate 32 may be filled in the hole 38 provided to dispose the first temperature sensor 39 and the second temperature sensor 40 in the holding plate 32. Owing to the above structure, the hole 38 provided in the holding plate 32 less gives a deleterious effect on the heat treatment of the wafer W.

Furthermore, in the above embodiment, though the example in which the wafer W is used for a substrate, the present invention is not limited to such an example, but is applicable to an example in which a LCD substrate is used.

The above described embodiment is strictly intended to bring the technical contents of the present invention into focus. Therefore, the present invention should not be interpreted in a narrow sense by limiting to such a concrete example, but it is applicable in various forms within the range of the spirit of the present invention and the extent described in the claims.

What is claimed is:

1. An apparatus for adjusting a temperature of a target substrate during manufacturing of a semiconductor device, the apparatus comprising:
    a holding plate having a mount face on which the substrate is mounted;
    a supply section that supplies thermal energy to the mount face through the holding plate;
    first and second temperature sensors arranged in the holding plate, wherein said first and second temperature sensors detect temperatures of first and second positions at different depths from the mount face in the holding plate, respectively; and
    a controller that estimates a temperature curve in the holding plate based on temperatures of the first and second positions detected by the first and second temperature sensors, estimates a mount face temperature based on the temperature curve, and sets the thermal energy to be supplied from the supply section to the mount face, such that the estimated temperature of the mount face becomes a process temperature.

2. The apparatus according to claim 1, wherein the supply section comprises a heater and the thermal energy is heat.

3. The apparatus according to claim 1, wherein the supply section comprises a cooler and the thermal energy is cooling energy.

4. The apparatus according to claim 1, wherein the supply section electrically generates the thermal energy, and the controller electrically sets the thermal energy to be supplied from the supply section.

5. The apparatus according to claim 4, wherein the controller adjusts electric current to be supplied to the supply section to set the thermal energy to be supplied from the supply section.

6. The apparatus according to claim 1, wherein the controller estimates the temperature curve with reference to a predetermined temperature table.

7. The apparatus according to claim 1, wherein the first and second positions are located on a line extending substantially perpendicular to the mount face, such that the estimated temperature of the mount face is the process temperature.

8. The apparatus according to claim 1, wherein a hole is formed in the holding plate from a second face, and the first and second temperature sensors are disposed in the hole.

9. The apparatus according to claim 8, wherein the hole is filled with a member consisting essentially of a material the same as that of the holding plate.

10. The apparatus according to claim 1, further comprising a third temperature sensor arranged in the holding plate, and configured to detect a temperature of third position at a depth from the mount face, different from those of the first and second positions, in the holding plate, wherein the controller estimates the temperature curve in the holding plate based on temperatures of the first to third positions detected by the first to third temperature sensors.

11. The apparatus according to claim 1, wherein the controller is configured to set the thermal energy to be supplied from the supply section, based on the temperatures of the first and second positions during a first period, and then based on the temperature of the first position after the first period.

12. The apparatus according to claim 11, wherein the first period is a period exceeding an estimated period in which the mount face reaches a desired temperature.

13. An apparatus for heating a target substrate during manufacturing of a semiconductor device, the apparatus comprising:
    a holding plate having a mount face on which the substrate is mounted;
    a heater configured to electrically generate heating energy and supply the heating energy to the mount face through the holding plate;
    first and second temperature sensors arranged in the holding plate, and configured to detect temperatures of first and second positions at different depths from the mount face in the holding plate, respectively, wherein a hole extending substantially perpendicular to the mount face is formed in the holding plate from a second face, and the first and second temperature sensors are disposed in the hole; and
    a controller that estimates a temperature curve in the holding plate based on temperatures of the first and second positions detected by the first and second temperature sensors, estimates a mount face temperature based on the temperature curve, and electrically sets the heating energy to be supplied from the heater to the mount face, such that the estimated temperature of the mount face is becomes a process temperature.

14. The apparatus according to claim 13, further comprising a lid that covers the substrate while mounted on the mount face, the lid having an exhaust port at a position corresponding substantially to a center position of the substrate mounted on the mount face.

15. The apparatus according to claim 14, further comprising a mechanism that blows a heating gas onto the substrate mounted on the mount face.

16. The apparatus according to claim 13, wherein the hole substantially aligns with a center position of the substrate mounted on the mount face.

17. An apparatus for cooling a target substrate during manufacturing of a semiconductor device, the apparatus comprising:
    a holding plate having a mount face on which the substrate is mounted;
    a cooler configured to supply cooling energy through the holding plate;
    first and second temperature sensors arranged in the holding plate, and configured to detect temperatures of the first and second positions at different depths from the mount face in the holding plate, wherein a hole extending substantially perpendicular to the mount face is formed in the holding plate from a second face, and wherein the first and second temperature sensors are disposed in the hole; and
    a controller that estimates a temperature curve in the holding plate based on temperatures of the first and second positions detected by the first and second temperature sensors, respectively, estimates a mount face temperature based on the temperature curve, and sets the cooling energy to be supplied from the cooler to the mount face, such that the estimated temperature of the mountain face becomes a process temperature.

18. The apparatus according to claim 17, further comprising a cooler which supplies a cooling gas onto the substrate mounted on the mount face.

19. The apparatus according to claim 18, wherein the hole is located at a position shifted from a center position of the substrate mounted on the mount face toward the cooler that supplies the cooling gas.

20. A method of using an apparatus for adjusting a temperature of a target substrate during manufacturing of a semiconductor device, the apparatus comprising
- a holding plate with a mount face on which the substrate is mounted,
- a supply section configured to supply thermal energy to the mount face through the holding plate, and
- first and second temperature sensors arranged in the holding plate, and detect temperatures of first and second positions at different depths from the mount face in the holding plate, respectively;

the method comprising the steps of:
- placing the substrate on the mount face;
- detecting temperatures of the first and second positions by the first and second temperature sensors, respectively; and
- using a controller to estimate a temperature curve in the holding plate based on the detected temperatures of the first and second positions, then estimating a mount face temperature based on the temperature curve, and setting the thermal energy to be supplied from the supply section to the mount face, such that the estimated temperature of the mount face becomes a process temperature.

21. The apparatus according to claim 20, wherein the controller estimates the temperature curve with reference to a predetermined temperature table.

* * * * *